United States Patent [19]

Ogawa

[11] Patent Number: 5,274,253
[45] Date of Patent: Dec. 28, 1993

[54] SEMICONDUCTOR PROTECTION DEVICE AGAINST ABNORMAL VOLTAGE

[75] Inventor: Keiji Ogawa, Tokyo, Japan

[73] Assignee: NEC Corporation, Tokyo, Japan

[21] Appl. No.: 737,397

[22] Filed: Jul. 29, 1991

[30] Foreign Application Priority Data

Jul. 30, 1990 [JP] Japan .................................. 2-201753

[51] Int. Cl.⁵ .......................................... H01L 29/74
[52] U.S. Cl. ..................................... 257/111; 257/163; 257/169; 257/170
[58] Field of Search ............... 357/38, 13, 38 E, 38 C, 357/38 T, 68; 257/109, 111, 163, 169, 170

[56] References Cited

U.S. PATENT DOCUMENTS

| | | | |
|---|---|---|---|
| 3,739,236 | 6/1973 | Loro | 357/38 |
| 4,631,561 | 12/1986 | Foroni et al. | 357/13 |
| 4,967,256 | 10/1990 | Pathak et al. | 357/38 |
| 5,001,537 | 3/1991 | Colman et al. | 357/13 |
| 5,111,268 | 5/1992 | Temple | 357/38 |

FOREIGN PATENT DOCUMENTS

1-165170  6/1989  Japan .................................. 357/38

*Primary Examiner*—Edward Wojciechowicz
*Assistant Examiner*—Courtney A. Bowers

[57] ABSTRACT

The semiconductor protection device has a p⁺-n⁻-p-n⁺ layer construction, and an n type impurity diffusion region is selectively formed in a surface portion of the pn junction. This n type impurity diffusion region is formed in a linear planar portion where substantially no electric field concentration is generated when a reverse voltage is applied to the pn junction formed between the n⁻ type semiconductor region and the p type semiconductor region. Further, an electrode is provided in ohmic contact with both of the p type semiconductor region and the n⁺ type semiconductor region. This electrode is selectively made in contact with the p type semiconductor region at a position remote from the n type impurity diffusion region and adjacent to a curved planar portion of the pn junction where the electric field concentration tends to occur when a reverse voltage is applied to the pn junction formed between the n⁻ type semiconductor region and the p type semiconductor region.

1 Claim, 5 Drawing Sheets

SEMICONDUCTOR PROTECTION DEVICE AGAINST ABNORMAL VOLTAGE

BACKGROUND OF THE INVENTION

The present invention relates to a semiconductor protection device, and more specifically relates to a particular type of the semiconductor protection device for use in protection of a wire communication instrument etc. from an abnormal voltage etc. which is applied through a communication cable.

FIG. 1A is a plan view showing such type of the conventional semiconductor protection device, FIG. 1B is a sectional view taken along the line X—X' of FIG. 1A, and FIG. 1C is another sectional view taken along the line Y—Y' of FIG. 1A. As shown in these figures, the conventional semiconductor protection device is comprised of an $n^-$ type semiconductor region 1 having a necessary effective thickness, a $p^+$ type semiconductor region 2 disposed to form a pn junction in contact with an entire face of one of the two major faces of the $n^-$ type semiconductor region 1, a p type semiconductor region 3 disposed to selectively form a pn junction in the other of the two major faces of the $n^-$ type semiconductor region 1, which is opposite to said one major face on which the first-mentioned pn junction is formed with the $p^+$ type semiconductor region 2, an $n^+$ type semiconductor region 4 disposed within the p type semiconductor region 3 to form selectively a pn junction, an n type impurity diffusion region 5 formed in the device surface along an entire length of the pn junction between the $n^-$ type semiconductor region 1 and the p type semiconductor region 3, by implanting therealong an n type impurity at a suitable density, a first electrode 6 in ohmic contact with the $p^+$ type semiconductor region 2, a second electrode 7 provided in ohmic contact with both of the p type semiconductor region 3 and the $n^+$ type semiconductor region 4, and an insulating film 8 provided to protect the device surface.

When an abnormally high voltage is applied between the pair of first and second electrodes 6 and 7 of the device such that the first electrode 6 is held at a positive potential, avalanche phenomenon is induced in the impurity diffusion region 5 as the applied voltage exceeds a certain level because the pn junction formed between the $n^-$ type semiconductor region 1 and the p type semiconductor region 3 has the lowest breakdown voltage at a portion into which the n type impurity of suitable density is implanted to form the n type impurity diffusion region 5. Consequently, an electric current starts to flow from the first electrode 6 to the second electrode 7 through the $p^+$ type semiconductor region 2, $n^-$ type semiconductor region 1, and p type semiconductor region 3 so that the semiconductor protection device turns to ON-state in response to this avalanche current.

FIG. 2 shows general voltage-current characteristics observed in this state. In the FIG. 2 graph, a breakdown voltage $V_{BR}$ denotes a voltage at which the pn junction is broken down to start flowing of an electric current, a breakover current $I_{BO}$ denotes a maximum electric current flowing immediately before the protection device switches from the OFF-state to the ON state, and a holding current $I_H$ denotes a minimum electric current needed to hold the protection device in the ON-state.

FIG. 3 is an equivalent circuit diagram of the conventional semiconductor protection device. In the diagram, numeral 9 denotes a pnp transistor comprised of the $p^+$ type semiconductor region 2, the $n^-$ type semiconductor region 1 and the p type semiconductor region 3. Numeral 10 denotes an npn transistor comprised of the $n^-$ type semiconductor region 1, the p type semiconductor region 3 and the $n^+$ type semiconductor region 4. Numeral 11 denotes a zener diode formed of the pn junction comprised of the semiconductor regions 1–3 within the n type impurity diffusion region 5. Numeral 12 denotes an anode terminal composed of the first electrode 6. Numeral 13 denotes a cathode terminal composed of the second electrode 7. Character R denotes a parasitic resistance in the semiconductor region 3.

The holding current $I_H$ is one of the important characteristic values in the semiconductor protection device. Generally, this value should be set in a higher range for the better performance. For example, in case that a lightning surge is applied through a communication line into a semiconductor protection device used in a telephone switchboard during the course of operation, the semiconductor protection device turns to the ON-state to pass an abnormal current to the ground. Concurrently, the operating signal current also flows through the semiconductor protection device to the ground. Accordingly, the operating signal current tends to continuously flow through the semiconductor protection device even after the abnormal current due to lightning surge has completely passed away to the ground. In such case, if the holding current $I_H$ of the semiconductor protection device is lower than the operating signal current, the semiconductor protection device cannot return to the OFF-state due to the operating signal current.

On the other hand, the breakover current $I_{BO}$ is another of the important characteristic values. Since this value represents a degree of switchability of the semiconductor protection device to the ON-state, this value should be set in a smaller range for the better performance. Consequently, the breakover current $I_{BO}$ should be set as small as possible, while the holding current $I_H$ should be set as great as possible in the semiconductor protection device.

For this, as illustrated in an equivalent circuit diagram shown in FIG. 4, it might be advantageous to form a resistor switchable between $R_{off}$ and $R_{on}$ for branching a base current of the npn transistor 10. Namely, the resistor $R_{on}$ is effective when the transistor 10 turns to the ON-state and has a relatively great resistance so as to facilitate supply of an electric current to the base of the npn transistor 10. On the other hand, the resistor $R_{off}$ is effective when the transistor 10 returns to the OFF-state and has a relatively small resistance so as to suppress supply of an electric current to the base of the npn transistor 10 to facilitate turning-off of the transistor.

However, according to the inventors' experiments, it has been found in construction of the device of FIG. 1 that either component of the breakover current $I_{BO}$ due to breakdown of the semiconductor protection device and the holding current $I_H$ flowing at the last end under the ON-state during gradual reduction of a voltage passes through the pn junction formed between the $n^-$ type semiconductor region 1 and the p type semiconductor region 3 at the same curved portion observed on the plan view of FIG. 1. Namely, as indicated by the arrow C in FIG. 1, the electric current flows across the pnp triple layers from the first electrode 6 to the second electrode 7 through sequentially the p+ type semiconductor region 2, the n− type semiconductor region, 1, then the curved portion, when observed in the plan view of FIG. 1, of the pn junction formed between the n− type semiconductor region 1 and the p type semiconductor region 3, and lastly the p type semiconductor region 3 in a horizontal direction under the n+ type semiconductor region 4.

For this reason, in the construction of the device of FIG. 1, either of the equivalent resistors $R_{on}$ and $R_{off}$ indicated in FIG. 4 has the same resistance value defined from the curved portion, when observed in the plan view, of the pn junction formed between the n− type semiconductor region 1 and the p type semiconductor region 3 to an ohmic contact region between the p type semiconductor region 3 and the second electrode 7 through a transverse length of the p type semiconductor region 3. Stated otherwise, the resistors $R_{on}$ and $R_{off}$ actually cannot be formed separately from each other in the conventional construction. As shown in FIG. 3, its equivalent circuit contains a single of the base resistor R. Such type of the semiconductor protection device having the FIG. 3 equivalent circuit cannot suppress the breakover current $I_{BO}$ in a relatively low level while maintaining the holding current $I_H$ in a relatively high level.

SUMMARY OF THE INVENTION

An object of the present invention is to provide an improved semiconductor protection device having an equivalent circuit, for example, shown in FIG. 4.

The inventive semiconductor protection device has a p+-n−-p-n+ layer construction, and an n type impurity diffusion region is selectively formed in a surface portion of the pn junction. This n type impurity diffusion region is formed in a linear planar portion where substantially no electric field concentration is generated when a reverse voltage is applied to the pn junction formed between the n− type semiconductor region and the p type semiconductor region. Further, an electrode is provided in ohmic contact with both of the p type semiconductor region and the n+ type semiconductor region. This electrode is selectively made in contact with the p type semiconductor region at a position remote from the n type impurity diffusion region and adjacent to a curved planar portion of the pn junction where the electric field concentration tends to occur when a reverse voltage is applied to the pn junction formed between the n− type semiconductor region and the p type semiconductor region.

DETAILED DESCRIPTION OF EMBODIMENTS

Figure 1A:
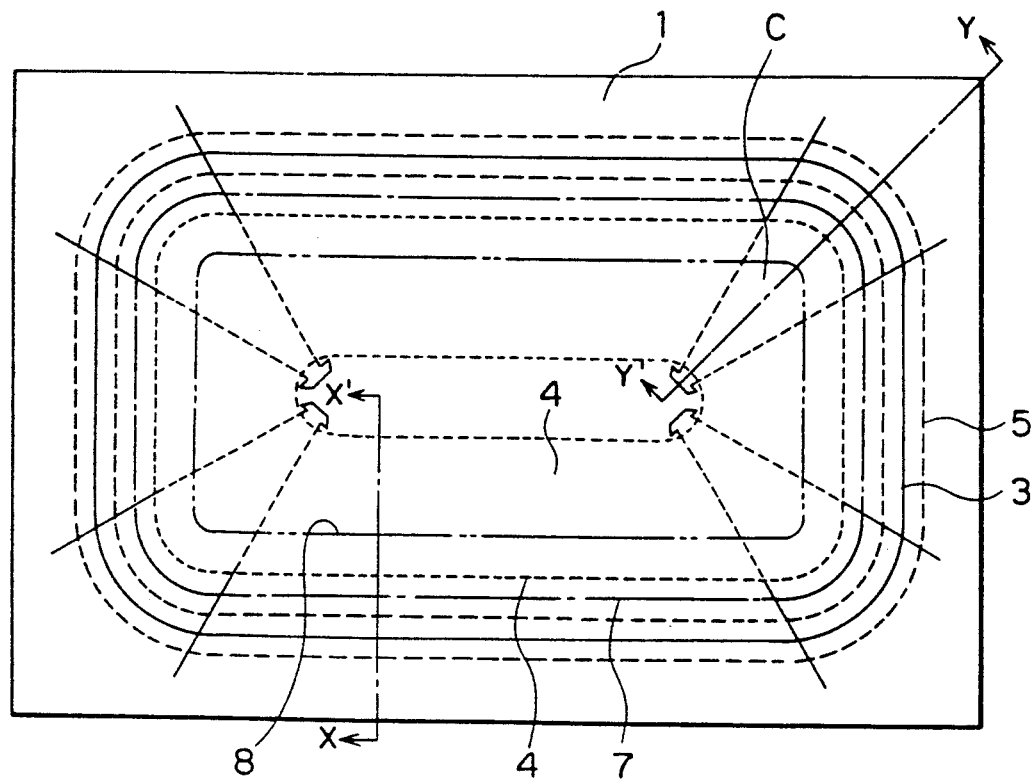
FIG. 1A is a plan view showing the prior art.
Figure 1B:
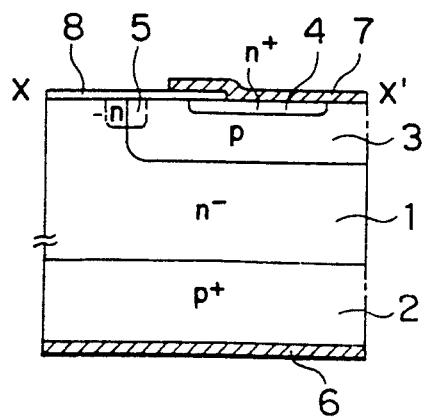
FIG. 1B is a sectional view taken along the line X—X' of FIG. 1A.
Figure 1C:
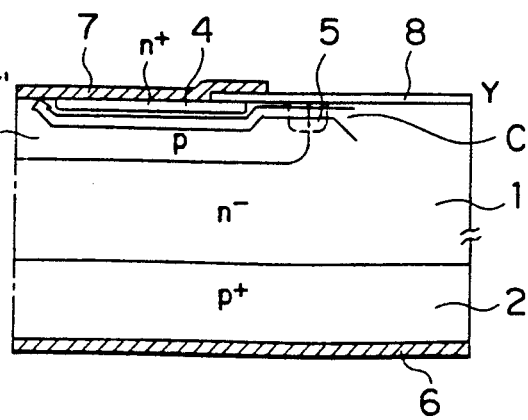
FIG. 1C is another sectional view taken along the line Y—Y' of FIG. 1A.
Figure 2:
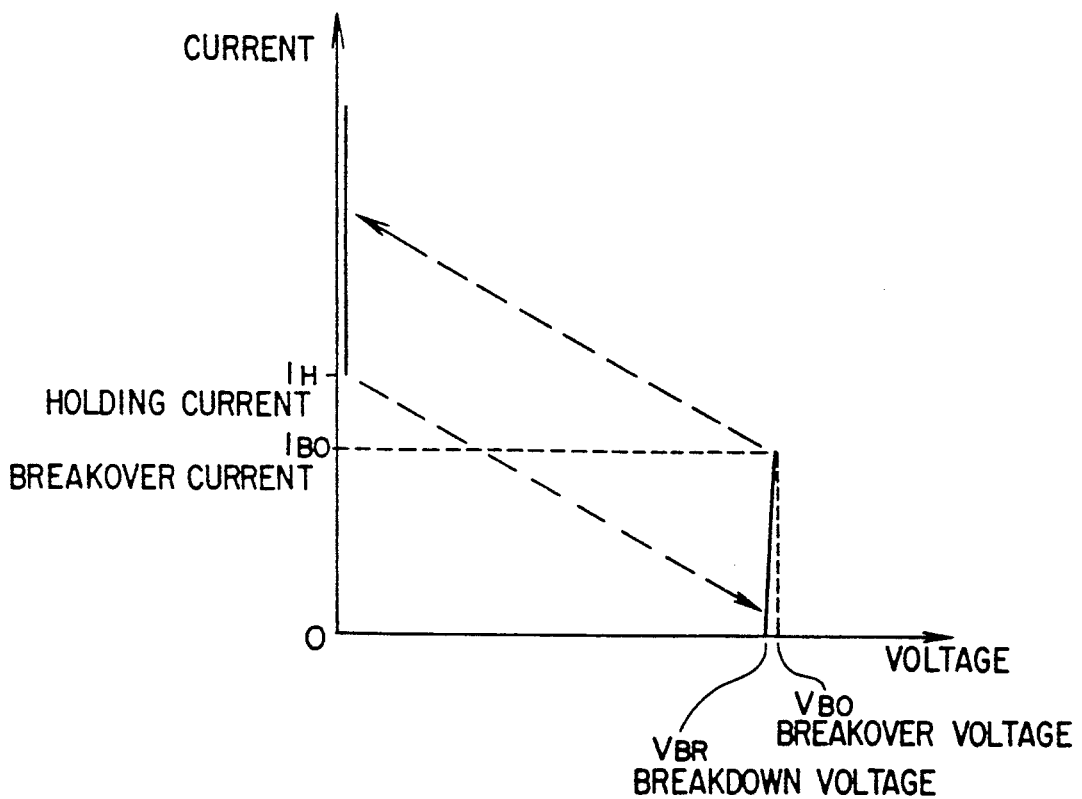
FIG. 2 is a graph showing general voltage-current characteristics of the semiconductor protection device.
Figure 3:
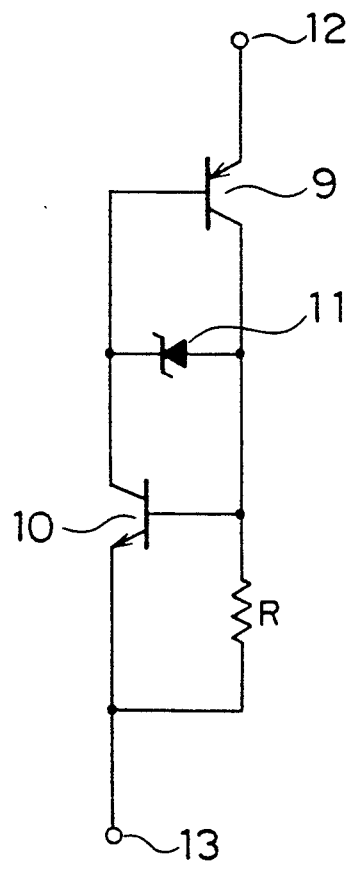
FIG. 3 is an equivalent circuit diagram of the prior art.
Figure 4:
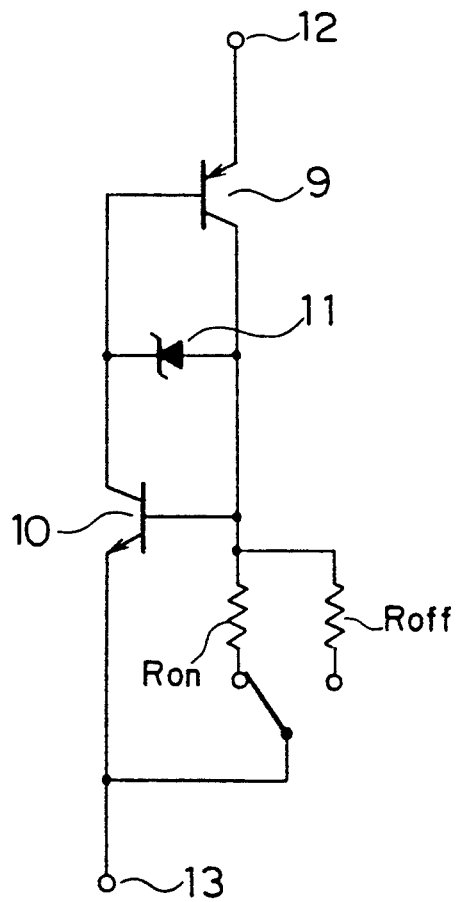
FIG. 4 is another equivalent circuit diagram of a semiconductor protection device having desired performance.
Figure 5A:
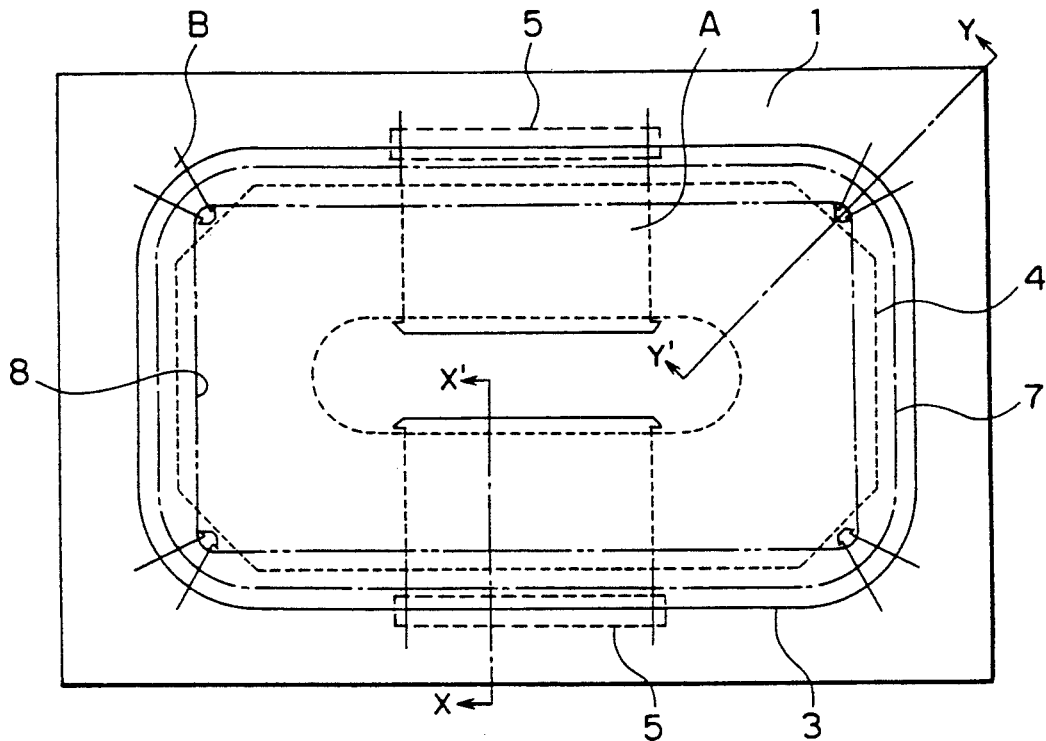
FIG. 5A is a plan view showing one embodiment of the inventive semiconductor protection device.
Figures 5B, 5C:
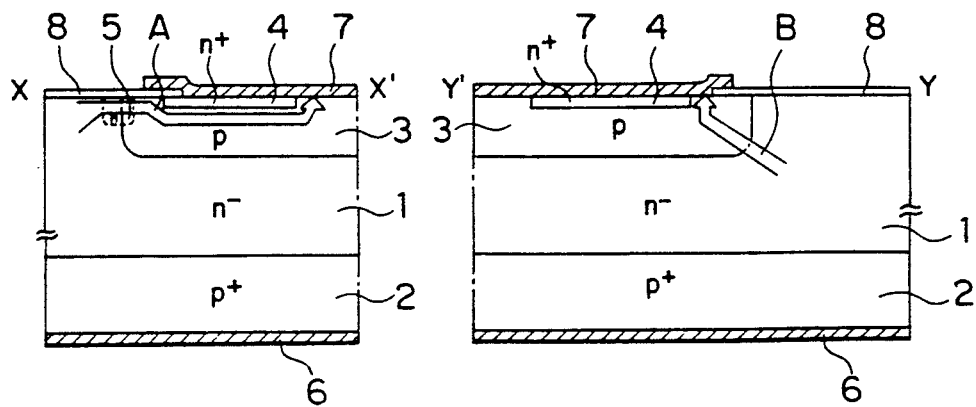
FIG. 5B is a sectional view thereof taken along the line X—X' of FIG. 5A.
FIG. 5C is another sectional view of the same device taken along the line Y—Y' of FIG. 5A.

Next, the description is given for preferred embodiments of the present invention with reference to the drawings. FIG. 5A is a plan view showing one embodiment of the present invention, FIG. 5B is a sectional view taken along the line X—X' of FIG. 5A, and FIG. 5C is another sectional view taken along the line Y—Y' of FIG. 5A.

As shown in these figures, the semiconductor protection device of this embodiment is comprised basically of a four-layer structure of pnpn type composed of an n− type semiconductor region 1 having an effective thickness sufficient to provide a needed withstanding voltage, a p+ type semiconductor region 2, a p type semiconductor region 3, and an n+ type semiconductor region 4. Additionally, an n type impurity diffusion region 5 is formed between the n− type semiconductor region 1 and the p type semiconductor region 3 so as to control a reverse withstanding voltage of a pn junction formed therebetween. The region 5 is formed by implanting an impurity into a surface portion of this pn junction. In contrast to the prior art, this impurity diffusion region 5 is not formed over the entire surface of the pn junction, but is formed selectively on a linear portion having a planar shape including no curved edge.

A first electrode 6 is provided on a bottom face of the device in contact with the p+ type semiconductor region 2. A second electrode 7 is formed on a top face of the device in ohmic contact with the p type semiconductor region 3 and the n+ type semiconductor region 4. Further, an insulating film 8 is provided to protect the surface of the device. The second electrode 7 is selectively made in contact with the p type semiconductor region 3 at a center portion of the device and at a particular portion sufficiently remote from the n type impurity diffusion region 5 and adjacent to a curved edge of the pn junction formed between the n− type semiconductor region 1 and the p type semiconductor region 3.

In such construction, an electric current flows, when the semiconductor protection device turns to the ON-state, from the n type impurity diffusion region 5 to a central region of the device in which the p type semiconductor region 3 and the second electrode 7 are in ohmic contact with each other, through a relatively long path as indicated by the arrow A, thereby increasing an ON-state resistance $R_{on}$. On the other hand, when the device returns to the OFF-state, an electric current flows, as indicated by the arrow B, from a curved or corner portion of the pn junction formed between the n− type semiconductor region 1 and the p type semiconductor region 3 to an adjacent ohmic contact region formed between the p type semiconductor region 3 and the second electrode 7 through a relatively short path, thereby reducing an OFF-state resistance $R_{off}$. Accordingly, by such construction, there can be obtained a semiconductor protection device having a reduced breakover current $I_{BO}$ and an increased holding current $I_H$.

For example, the n⁻ type semiconductor region 1 contains a phosphorus at an impurity density of about $4 \times 10^{14}$ cm⁻³, the p type semiconductor region 3 contains a boron implanted over 10 hours at a dose of about $1 \times 10^{15}$ cm⁻², and the n⁺ type semiconductor region 4 contains a phosphorus at an impurity density of about $9 \times 10^{15}$ cm⁻³. In such case, the conventional consruction may exhibit a breakover current $I_{BO}$ in the order of 30 mA and a holding current $I_H$ in the order of 25 mA. On the other hand, in the inventive construction, the breakover current $I_{BO}$ can be maintained in a comparable order, while the holding current $I_H$ can be ensured over 100 mA.

Figure 6A:
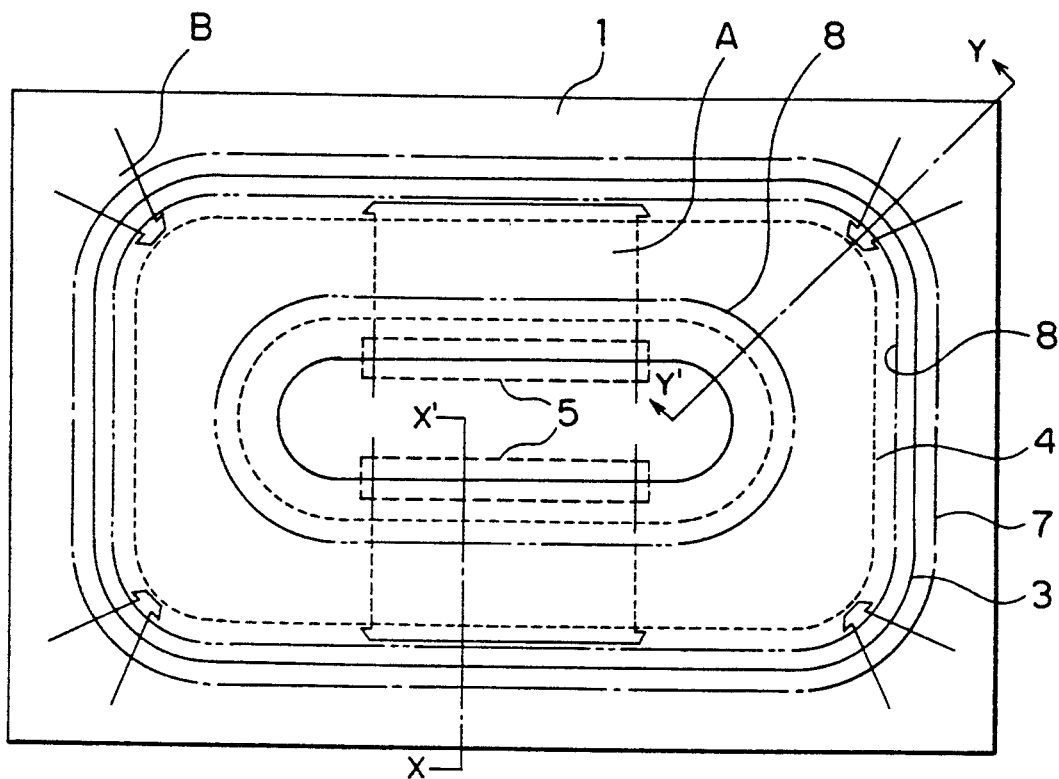
FIG. 6A is a plan view showing another embodiment of the present invention.
Figure 6B:
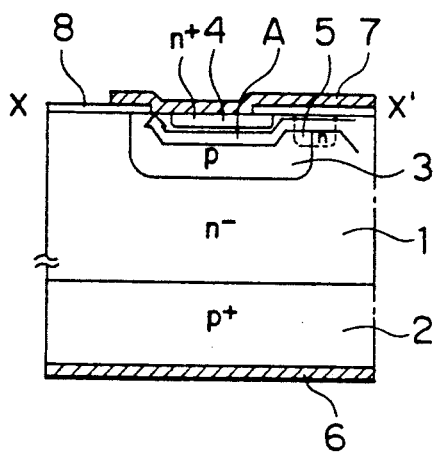
FIG. 6B is a sectional view taken along the line X—X' of FIG. 6A.
Figure 6C:
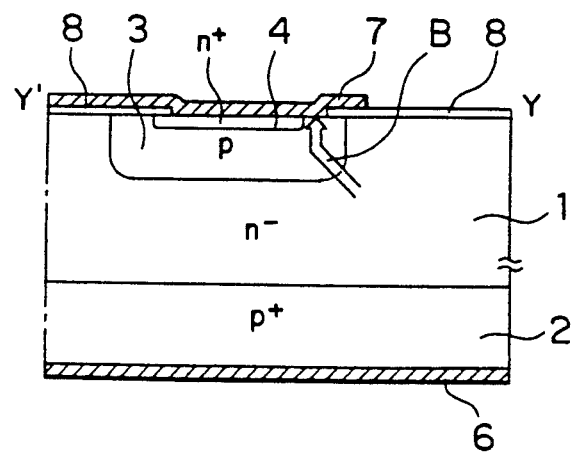
FIG. 6C is another sectional view taken along the line Y—Y' of FIG. 6A.

FIG. 6A is a plan view showing another embodiment of the present invention, FIG. 6B is a sectional view taken along the line X—X' of FIG. 6A, and FIG. 6C is another sectional view taken along the line Y—Y' of FIG. 6A. In this embodiment, a p type semiconductor region 3 is formed of a ring-like shape. Therefore, a pn junction is formed in a surface portion of the device separately inside and outside between an n⁻ type semiconductor region 1 and the p type semiconductor region 3. An n type impurity diffusion region 5 is formed inside of the ring-like region 3 on a linear portion of the pn junction having no curvature so as to control a reverse breakdown voltage of the pn junction. Further, a second electrode 7 is formed on ohmic contact with the p type semiconductor region 3 and with an n⁺ type semiconductor region 4. The second electrode 7 is selectively made in contact with the p type semiconductor region 3 along a ring-like pattern adjacent to the curved or corner portion of the outside pn junction formed between the n⁻ type semiconductor region 1 and the p type semiconductor region 3.

By such construction, when the semiconductor protection device turns to the ON-state, an electric current flows, as indicated by the arrow A, from the n type impurity diffusion region disposed in the central portion of the device to a particular portion in which the p type semiconductor region 3 and the second electrode 7 are in ohmic contact with one another along a periphery of the device through a relatively long path, thereby increasing the ON-state resistance $R_{on}$. On the other hand, when returning to the OFF-state, an electric current flows, as indicated by the arrow B, from a planar curved portion of the outside region of the pn junction formed between the n⁻ type semiconductor region 1 and the p type semiconductor region 3 in the device surface to an adjacent ohmic contact region formed between the p type semiconductor region 3 and the second electrode 7 through a relatively short path, thereby reducing the OFF-state resistance $R_{off}$. Accordingly by such construction, in a manner similar to the previous embodiment, there can be realized an improved semiconductor protection device having a small breakover current $I_{BO}$ and a large holding current $I_H$.

As described above, according to the present invention, a contact portion between the p type semiconductor region and the second electrode, i.e., cathode electrode is separated remote from the n type impurity diffusion region in which breakdown is initiated, and is simultaneously disposed adjacent to a planar curved portion of the pn junction through which an electric current flows under the OFF-state so as to prolong the ON-state electric current path and to shorten the OFF-state electric current path. By such construction, a resistance interposed in parallel between base and emitter of an npn transistor can be increased under the ON-state and decreased under the OFF-state. Consequently, according to the present invention, there can be provided a semiconductor protection device having a small breakover current $I_{BO}$ and a large holding current $I_H$.

What is claimed is:

1. A semiconductor protection device comprising: a first semiconductor region of a first conductivity type; a second semiconductor region of a second conductivity type provided on a first major face of said first semiconductor region; a third semiconductor region of the second conductivity type formed selectively in a surface region of a second major face of said first semiconductor region; a fourth semiconductor region of the first conductivity type formed selectively in a surface region of the third semiconductor region; a first electrode disposed in ohmic contact with said second semiconductor region; and a second electrode disposed in ohmic contact with said third semiconductor region and said fourth semiconductor region, said third semiconductor region having a relatively shorter OFF-state electric current path and a relatively longer ON-state electric current path, said second electrode having a portion in contact with said forth semiconductor region and a portion in contact with said third semiconductor region at first and second junction portions, said OFF-state electric current path being defined between said first junction portion and a pn junction formed between said third semiconductor region and said first semiconductor region, and said ON-state electric current path being defined between said second junction portion and said pn junction formed between said third semiconductor region and said first semiconductor region, said (third) fourth semiconductor region being a ring-like region formed on said second major face, said portion of said second electrode which is in contact with said third semiconductor region having one section inside the ring-like region and another section outside said ring-like region and in the vicinity of a curved planar portion of said pn junction formed between said third semiconductor region and said first semiconductor region.

* * * * *